(12) United States Patent
Singer

(10) Patent No.: US 9,515,242 B2
(45) Date of Patent: Dec. 6, 2016

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventor: Frank Singer, Regenstauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/399,967

(22) PCT Filed: Apr. 26, 2013

(86) PCT No.: PCT/EP2013/058744
§ 371 (c)(1),
(2) Date: Nov. 10, 2014

(87) PCT Pub. No.: WO2013/167399
PCT Pub. Date: Nov. 14, 2013

(65) Prior Publication Data
US 2015/0115304 A1    Apr. 30, 2015

(30) Foreign Application Priority Data

May 11, 2012  (DE) ......................... 10 2012 207 854

(51) Int. Cl.
*H01L 33/00* (2010.01)
*H01L 33/64* (2010.01)
(Continued)

(52) U.S. Cl.
CPC .............. *H01L 33/644* (2013.01); *F21K 9/56* (2013.01); *F21V 9/16* (2013.01); *F21V 29/70* (2015.01);
(Continued)

(58) Field of Classification Search
CPC ... H01L 33/644; H01L 33/483; H01L 33/50; H01L 33/005; H01L 33/62; C23C 24/08

USPC ................................................ 257/98; 438/27
See application file for complete search history.

(56) References Cited

U.S. PATENT DOCUMENTS

2003/0098651 A1 * 5/2003 Lin ...................... H01L 33/483
313/600
2009/0159912 A1   6/2009 Engl et al.
(Continued)

FOREIGN PATENT DOCUMENTS

DE   102006005299 A1   8/2007
EP    1 804 304    * 12/2005 ............. H01L 33/50
(Continued)

OTHER PUBLICATIONS

International Search Report issued on Aug. 19, 2014 in PCT/EP2013/058744.
(Continued)

*Primary Examiner* — Tuan Nguyen
(74) *Attorney, Agent, or Firm* — Viering, Jentschura & Partner mbB

(57) ABSTRACT

An optoelectronic component may include a carrier element having a heat sink, at least one semiconductor chip for emitting electromagnetic radiation which is mounted and electrically contact-connected on the carrier element, a radiation-transmissive cover disposed downstream of the at least one semiconductor chip, a converter layer applied on the radiation-transmissive cover and spaced apart from the at least one semiconductor chip, a frame composed of thermally conductive material, which frame extends around the at least one semiconductor chip and is in direct contact with the converter layer, and at least one connecting element for thermally connecting the frame to the heat sink.

17 Claims, 5 Drawing Sheets

(51) Int. Cl.
*F21K 99/00* (2016.01)
*H01L 33/50* (2010.01)
*F21V 9/16* (2006.01)
*F21V 29/70* (2015.01)
*H01L 33/62* (2010.01)
*H01L 25/075* (2006.01)
*H01L 33/48* (2010.01)
*F21Y 101/02* (2006.01)
*F21Y 105/00* (2016.01)

(52) U.S. Cl.
CPC ........... *H01L 33/005* (2013.01); *H01L 33/483* (2013.01); *H01L 33/50* (2013.01); *H01L 33/507* (2013.01); *H01L 33/62* (2013.01); *F21Y 2101/02* (2013.01); *F21Y 2105/001* (2013.01); *H01L 25/0753* (2013.01); *H01L 33/486* (2013.01); *H01L 2924/0002* (2013.01); *H01L 2933/0033* (2013.01); *H01L 2933/0041* (2013.01); *H01L 2933/0075* (2013.01)

(56) References Cited

U.S. PATENT DOCUMENTS

| | | |
|---|---|---|
| 2010/0025656 A1 | 2/2010 | Raring et al. |
| 2010/0133556 A1 | 6/2010 | Li et al. |
| 2010/0149783 A1 | 6/2010 | Takenaka et al. |
| 2010/0224893 A1* | 9/2010 | Liepold ................... C23C 24/08 257/98 |
| 2011/0156072 A1 | 6/2011 | Ling |
| 2011/0175114 A1* | 7/2011 | Liao ..................... H01L 25/0753 257/88 |
| 2011/0193473 A1 | 8/2011 | Sanders et al. |
| 2012/0001214 A1 | 1/2012 | Ooyabu et al. |

FOREIGN PATENT DOCUMENTS

| | | | | |
|---|---|---|---|---|
| EP | 1804304 | * | 12/2005 | ............ H01L 33/00 |
| EP | 1804304 A2 | | 7/2007 | |
| WO | 2012053386 A1 | | 4/2012 | |
| WO | JP 2012/053386 | * | 4/2012 | |
| WO | WO 2012053386 | * | 4/2012 | ............ H01L 33/00 |
| WO | WO 2012053386 | * | 4/2012 | ............ H01L 33/50 |

OTHER PUBLICATIONS

Examination Report issued in the German patent application No. 10 2012 207 854.1 on Mar. 11, 2013.

* cited by examiner

OPTOELECTRONIC COMPONENT AND METHOD FOR PRODUCING AN OPTOELECTRONIC COMPONENT

RELATED APPLICATIONS

The present application is a national stage entry according to 35 U.S.C. §371 of PCT application No.: PCT/EP2013/058744 filed on Apr. 26, 2013, which claims priority from German application No.: 10 2012 207 854.1 filed on May 11, 2012, and is incorporated herein by reference in its entirety.

TECHNICAL FIELD

Various embodiments generally relate to an optoelectronic component and to a method for producing an optoelectronic component.

In particular, various embodiments relate to an optoelectronic component including a converter layer arranged in a manner spaced apart from the semiconductor chip.

BACKGROUND

Applications with optoelectronic components, for example LEDs, are increasingly gaining in importance. They include not only illuminants such as lamps, for example, but also backlighting systems for LC screens or monitors, for example, or applications in the motor vehicle sector, for example in interior lighting or as headlights. In the present application, the term optoelectronic component denotes an element which emits light in the visible, infrared and/or UV range in operation when supplied with electrical energy. This includes not only semiconductor-based light-emitting diodes but also organic light-emitting diodes, combinations of organic and inorganic compounds suitable for light emission, lasers and other light-emitting components.

A non-exhaustive example of an optoelectronic component includes an electrically contact-connected semiconductor chip for emitting electromagnetic radiation and a converter element applied on the semiconductor chip. The semiconductor chip emits a primary radiation during operation and part of the primary radiation is converted into a secondary radiation having a different wavelength in the converter element. The resulting radiation of the optoelectronic semiconductor component arises from the superimposition of the primary radiation transmitted by the converter element and the secondary radiation generated. In this regard, it is possible to provide, in particular, light sources which emit a white light. Since the efficiency of the converter element decreases as the temperature rises, the heat arising in the converter element is dissipated via the chip.

SUMMARY

Various embodiments relate to an optoelectronic component including a carrier element having a heat sink, at least one semiconductor chip for emitting electromagnetic radiation which is mounted and electrically contact-connected on the carrier element, a radiation-transmissive cover disposed downstream of the at least one semiconductor chip, a converter layer applied on the radiation-transmissive cover and spaced apart from the at least one semiconductor chip, a frame composed of thermally conductive material, which frame extends around the at least one semiconductor chip and is in direct contact with the converter layer, and at least one connecting element for thermally connecting the frame to the heat sink.

The efficiency of the converter layer is greatly dependent on the temperature. As a result of the known mounting directly onto the semiconductor chip as used hitherto, the converter layer is heated to the junction temperature by the semiconductor chip. In the case of partial conversion or full conversion, an additional heating occurs in the converter layer, which additionally adversely influences the efficiency.

This heat is usually dissipated via the semiconductor chip, which in turn increases the temperature in the light-generating layer of the semiconductor chip. Overall, therefore, in the case of known optoelectronic components, the dissipation of heat is difficult and the efficiency of the converter layer is thus reduced.

As a result of the present disclosure, the converter layer is thermally decoupled from the semiconductor chip and thermally well linked to the heat sink. As a result of the spacing between converter layer and semiconductor chip, the heat transfer between semiconductor chip and converter layer is thus prevented or significantly reduced. At the same time, the thermally conductive frame which is in direct contact with the converter layer and which is in turn thermally linked to the heat sink by means of the connecting elements ensures an optimum heat dissipation of the heat generated in the converter layer. The converter layer is thus thermally decoupled from the semiconductor chips and there is no feedback of the heat losses of the converter layer to the semiconductor chips, and vice versa. The entire system is thus subjected to better heat dissipation and thus becomes more efficient, since the converter layer no longer completely has the high temperature of the semiconductor chips and, at the same time, the semiconductor chips no longer additionally experience a heat input as a result of the Stokes shift from the converter layer. Consequently, the present disclosure provides a more efficient optoelectronic component.

As a result of the spaced-apart converter layer in the sense of a so-called "remote phosphor", in the case of a plurality of semiconductor chips, the gaps between the individual semiconductor chips are completely or at least approximately completely blurred, such that a complex downstream imaging optical unit is no longer required in order to scatter or mix the emitted radiation in such a way that the gaps between the semiconductor chips are no longer visible. For example in projection applications such as, for example, motor vehicle headlights or in mini LED projectors, the gaps between the semiconductor chips often have to be compensated for in a relatively complex manner by suitable measures in the imaging optical unit. Consequently, the present disclosure provides an optoelectronic component which is simplified in its construction and is thus more cost-effective and simpler to produce.

Furthermore, the optoelectronic component according to the present disclosure has the advantage that it may be adapted to different types and numbers of semiconductor chips more simply and is thus more flexible. Over the course of time, for example, semiconductor chips become ever brighter and more efficient. However, upper limits for the brightness are defined in some systems. If, with an unchanged construction of the optoelectronic component, the semiconductor chips are replaced by brighter semiconductor chips over time, said upper limits are exceeded. In order not to exceed these upper limits, the number of semiconductor chips may be reduced in multi-chip modules such as, for example, in projection applications or headlight applications. In the case of known optoelectronic components, however, this means an intervention in the optical imaging system and extensive alterations are necessary for every change of type and/or number of semiconductor chips. This problem is reduced by the present disclosure since, as a result of the converter layer spaced apart from the at least one semiconductor chip, a whole-area covering of the semiconductor chip array is achieved and the type and number of semiconductor chips may easily be altered without having to adapt the construction of the rest of the optoelectronic component. As a result, different chip arrangements with an identical optical characteristic are possible, without having to adapt the rest of the imaging system. By way of example, the converter area may firstly be irradiated by five 1 mm$^2$ chips, and later, if enough efficient semiconductor chips are present, this may be possible by means of four 1 mm$^2$ chips or for example by seven 750 µm$^2$ chips. Consequently, the present disclosure provides an optoelectronic component which is simply and flexibly adaptable to an altered number and/or types of semiconductor chips.

In accordance with one embodiment, the converter layer is applied on that side of the radiation-transmissive cover which faces the at least one semiconductor chip. This has the advantage that the converter layer is protected against external effects, for example mechanical loads, and thus has an increased lifetime.

In accordance with one embodiment, the optoelectronic component furthermore includes a light-guiding layer between the at least one semiconductor chip and the converter layer. Said light guide may reduce or completely compensate for possible coupling losses on account of the spacing between converter layer and semiconductor chip. The light guide improves, in particular, firstly the coupling out of the at least one semiconductor chip and secondly the coupling into the converter layer.

In accordance with one embodiment, it is provided that the radiation-transmissive cover includes or consists of a plastics material, glass and/or ceramic material, preferably a monolithic glass. The stated materials are distinguished by simple and cost-effective production and by robustness and thus a long lifetime. Furthermore, the use of the stated materials makes it possible to ensure a low absorption and/or reflection for electromagnetic radiation, such that the cover has a high transmissivity of in particular more than 80%, preferably more than 90%, for the electromagnetic radiation emitted by the at least one semiconductor chip and/or the converter layer. The effectiveness of the optoelectronic component is thus increased.

In accordance with one embodiment, the frame consists of silicon, aluminum, boron nitride, zinc oxide and/or aluminum nitride. These materials have a high thermal conductivity, such that an optimum dissipation of heat from the converter layer is ensured. Silicon furthermore has the advantage that it is particularly cost-effective and simple in terms of processing. The stated materials furthermore have the advantage that they are radiation-nontransmissive, i.e. the electromagnetic radiation emitted by the at least one semiconductor chip and/or the converter layer is not transmitted by the frame. The frame thus provides a diaphragm, such that the emission characteristic of the optoelectronic component may be influenced depending on the size and configuration of the frame. By way of example, a specific beam cone may be set in this way.

In accordance with one embodiment, the frame forms a shutter edge. By virtue of the configuration of the frame in such a way that it is possible to define a shutter edge, i.e. a defined bright-dark transition, the optoelectronic component may be used in applications in which the representation of a shutter edge is necessary, for example as headlights in the motor vehicle sector. A shutter edge is necessary particularly for the low-beam function in motor vehicle headlights. Particularly by virtue of the fact that the frame is situated near the light source, it is possible to achieve a sharp bright-dark transition.

In one preferred embodiment, the angle between a surface of the frame facing the at least one semiconductor chip and the main extension direction of the cover is an acute angle, said angle preferably being 55°±2°. As a result, the frame serves as a diaphragm and, at the same time, a sharp edge is imaged; as a result, a sharp bright-dark transition is achieved. Particularly by virtue of the fact that the frame is situated near the light source, light losses are minimized and, at the same time, a sharp edge is imaged, such as is required for example in motor vehicle headlights, in particular in the low-beam function of motor vehicle headlights. The optoelectronic component thus offers a compact construction and the sharp and near representation of a shutter edge. Overall, a compact design of the optoelectronic component with shutter edge, remote phosphor and flexible number of semiconductor chips is thus provided.

In one embodiment, the at least one connecting element includes a bump. The use of a bump makes it possible to achieve a simple and material-saving connection, since the frame is linked to the carrier element not over the whole area, but rather selectively and to the extent necessary.

Preferably, the bump is composed of gold, silver or palladium. Since these materials have a high thermal conductivity, an optimum heat dissipation of the heat from the frame to the heat sink in the carrier element is ensured in conjunction with material saving, as already described above. Particularly gold and palladium are extremely corrosion-resistant and thus aging-stable.

In one embodiment, an electrically insulating layer is provided between the frame and the bump, preferably having a thickness of a maximum of 0.5 µm. As a result, the bumps may be placed onto arbitrarily polarized surfaces of the carrier element, i.e. also onto contact pads having different potentials. This enables more flexibility in the configuration of the carrier element and the positioning of the bumps. In this case, the electrically insulating layer is advantageously kept so thin that the thermal conductivity between bumps and frame is not adversely affected, or is adversely affected only to an insignificant extent.

In one alternative embodiment, the at least one connecting element includes a thermally conductive adhesive. As a result, the frame may be connected to the carrier element very reliably. A mechanical fixing over and above that may be omitted.

In one embodiment, the carrier element has electrically conductive contact pads for electrically contact-connecting the at least one semiconductor chip, and the at least one connecting element is arranged along contact pads with identical electrical potential. As a result, a short circuit may be prevented. Moreover, as a result, a possibly electrically conductive layer between frame and connecting element or the like may be omitted, as a result of which the heat dissipation may proceed optimally.

In one alternative embodiment, the carrier element has electrically conductive contact pads for electrically contact-connecting the at least one semiconductor chip, and the at least one connecting element is arranged along one or a plurality of potential-free contact pads. As a result, a short circuit may be prevented. Moreover, as a result, a possibly electrically conductive layer between frame and connecting element or the like may be omitted, as a result of which the heat dissipation may proceed optimally.

Various embodiments furthermore relate to a method for producing an optoelectronic component, including providing a carrier element having a heat sink, providing at least one semiconductor chip for emitting electromagnetic radiation which is mounted and electrically contact-connected on the carrier element, providing an attachment for the carrier element, wherein the step of providing the attachment includes the following substeps:

providing a radiation-transmissive cover with a thermally conductive layer applied thereon, etching the thermally conductive layer for selectively exposing the radiation-transmissive cover in such a way that cavities are formed which are delimited by the cover and a frame composed of the radiation-transmissive material, applying a converter layer at least to the etched-free regions of the radiation-transmissive cover, applying at least one connecting element to the frame, and singulating the composite assembly into individual attachments along the frame, applying the attachment on the carrier element in such a way that the at least one semiconductor chip is arranged within the cavity and the frame extends around the at least one semiconductor chip, and thermally connecting the frame to the heat sink by means of the connecting elements.

The production method according to the disclosure enables optoelectronic components according to the present disclosure to be produced in a simple and efficient manner. The optoelectronic components are distinguished by a compact form, improved heat dissipation and a flexible number of semiconductor chips. The production method provides for producing a plurality of attachments in a composite assembly, as a result of which the method is particularly cost-effective and efficient. Particularly as a result of the use of a cover, preferably of a monolithic glass window, such as of a BF33 wafer, for example, and a thermally conductive layer, preferably a monolithic silicon layer for example in the form of 6" or 8" wafers or wafers of some other size, and subsequent etching-out of cavities, relatively large panels arise which may be coated wholly or else partly with the converter layer on the cavity inner side efficiently in one step. If appropriate, mounting areas may subsequently be freed of the converter layer by means of corresponding methods likewise in the composite assembly. The singulation step ensues only after the connecting elements have been applied. The production method thus enables simple production of larger quantities of attachments and thus of optoelectronic components.

In one embodiment, the step of applying the converter layer includes applying the converter layer by means of sedimentation. Sedimentation has the advantage that the converter layer may be applied directly to the cover. As a result, the converter layer is optimally linked to the cover, and the sudden change in refractive index is thus reduced.

In an alternative embodiment, the step of applying the converter layer includes applying an electrically conductive layer and subsequently applying the converter layer by means of electrophoresis. The electrophoresis enables the converter layer to be applied rapidly since, unlike in the case of sedimentation, it is not necessary to wait during sedimentation times.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1A:
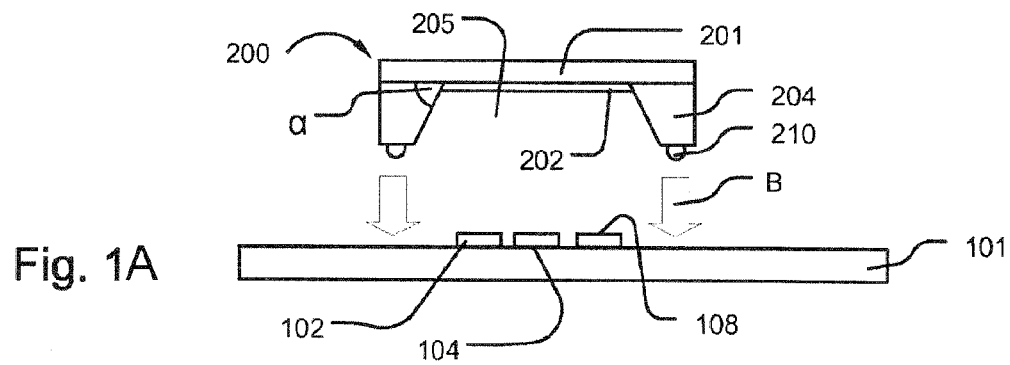
FIG. 1A shows a schematic illustration of a cross section of a preliminary stage of an optoelectronic component according to the disclosure in accordance with a first embodiment.
Figure 1B:
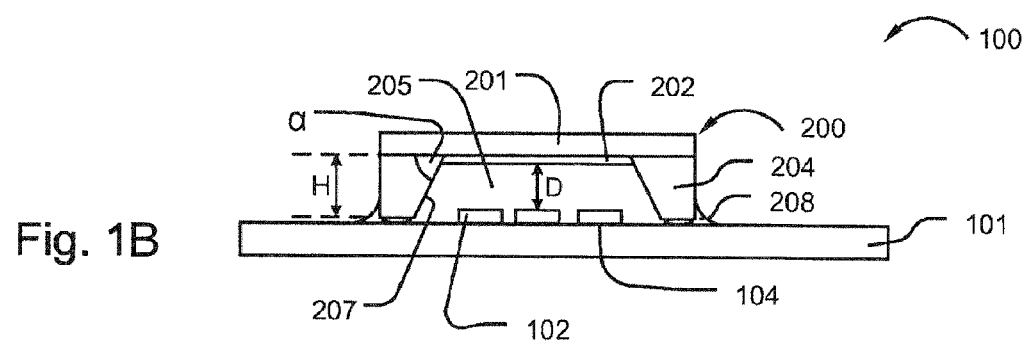
FIG. 1B shows a schematic illustration of a cross section of an optoelectronic component according to the disclosure in accordance with the first embodiment.

FIG. 1A shows a schematic illustration of a cross section of a preliminary stage of an optoelectronic component according to the disclosure in accordance with a first exemplary embodiment, and FIG. 1B shows a schematic illustration of a cross section of an optoelectronic component according to the disclosure in accordance with the first embodiment.

Six semiconductor chips 102 in a two by three matrix arrangement are mounted on a carrier element 101. Correspondingly, only three semiconductor chips 102 may be seen in the cross-sectional illustration. However, the present disclosure is not restricted to the illustrated number and arrangement of semiconductor chips 102. Rather, the present disclosure encompasses any optoelectronic component including at least one semiconductor chip 102. Likewise, any arbitrary arrangement of semiconductor chips 102 on the carrier element 101 is conceivable. In other words, an LED array composed of one or a plurality of semiconductor chips 102 is arranged on the carrier element 101. In this case, the semiconductor chips 102 may also differ from one another, for example in terms of construction and emission spectrum.

The semiconductor chips 102 are optoelectronic semiconductor chips 102, for example light-emitting diodes, OLEDs or other optoelectronic elements which emit or absorb electromagnetic radiation. The semiconductor chips 102 may be formed for example by a layer sequence produced in a semiconductor process on a semiconductor substrate. The semiconductor chips 102 may likewise have been produced by a thin-film method. The semiconductor chips 102 may also be substrateless. They have a contact side 104, by which they are applied on the carrier element 101 by means of known methods (LED die attach) and via which they have at least one electrical contact. In this case, it is conceivable for a further electrical contact also to be connected to the carrier element 101 via the contact side 104. However, any other type of contact-connection of the semiconductor chips 102 is also conceivable.

The carrier element 101 may be a leadframe or a substrate depending on the type of optoelectronic component to be produced. It serves for example for mechanically stabilizing the optoelectronic component and/or for electrically connecting the semiconductor chips 102 to external electrical contacts. The carrier element 101 may be, for example, a ceramic carrier, a metal-core circuit board or a semiconductor carrier. At the top side of the carrier element 102, i.e. at the side to which the semiconductor chips 102 are applied, electrical contacts for example in the form of conductor tracks or contact pads are provided for electrically contact-connecting the semiconductor chips 102. In accordance with FIG. 1A, the carrier element 101 simultaneously serves as a heat sink. The carrier element 101 thus completely consists of a thermally conductive material. Alternatively, a heat sink may also be integrated as dedicated components into the carrier element 101. In particular, the carrier element 101 may be or include an aluminum nitride AlN or aluminum oxide AlO substrate. The heat sink is configured, in particular, such that the semiconductor chips 102 to be applied may be applied directly on the heat sink and the heat to be dissipated from the semiconductor chips 102 may thus be emitted via the heat sink to a corresponding cooling device, for example cooling ribs or the like.

On the side opposite the contact side 104, the semiconductor chips 102 have a radiation emission side 108. Radiation generated in the semiconductor chips 102 is coupled out via the radiation emission side 108. In order that the generated radiation is coupled out as efficiently as possible, the carrier element 101 may have a reflective surface, for example a silver coating, in the region of the contact side 104.

The optoelectronic component 100 furthermore includes an attachment 200, which is likewise mounted onto the carrier element 101 and is mechanically connected thereto. FIG. 1A in this case illustrates the attachment 200 prior to mounting onto the carrier element 101 and separated from the carrier element 101 and the semiconductor chips 102. FIG. 1B illustrates the completed optoelectronic component 100 according to the disclosure in accordance with the first embodiment after the attachment 200 has been applied to the carrier element 101.

The attachment 200 has a radiation-transmissive cover 201, which, as illustrated in FIG. 1B, is arranged in a manner spaced apart from the semiconductor chips 102. Radiation-transmissive within the meaning of the present application is intended to be understood to the effect that the cover is 80%, preferably more than 90%, transmissive to electromagnetic radiation, in particular to electromagnetic radiation in the visible, UV and/or IR range. Alternatively, however, a filter may also be integrated into the cover 201, said filter filtering out and not transmitting predetermined radiation components. The cover 201 includes or consists of a plastics material, glass and/or ceramic material. Preferably, the cover 201 is a monolithic glass cover or, in other words, a monolithic glass window. The cover 201 may furthermore be embodied as an optical element, for example for use in a motor vehicle headlight. For this purpose, part of the outer surface of the headlight or of the motor vehicle may be formed by the cover 201.

A converter layer 202 is applied on the radiation-transmissive cover 201. In particular, the converter layer 202 is applied on that side of the cover 201 which faces the semiconductor chips 102. This has the advantage that the converter layer 202 is protected against external influences, in particular mechanical influences, by the cover 201. The converter layer 202 is likewise spaced apart from the semiconductor chips 102. The distance D between the semiconductor chips 102 and the converter layer is preferably a few tenths of a millimeter, in particular 0.1 mm to 0.9 mm, preferably 0.3 mm to 0.7 mm. As a result, the converter layer 202 is thermally decoupled from the semiconductor chips 102 and the heat generated in the converter layer 202 is not emitted to the semiconductor chips 102.

Likewise, the converter layer 202 is not heated by the heat generated in the semiconductor chips 102. However, the converter layer 202 may be applied on that side of the cover 201 which faces away from the semiconductor chips 102.

The converter layer 202 includes, in particular, one or a plurality of phosphors for the partial or complete conversion of the primary radiation emitted by the semiconductor chips 102 into one or a plurality of secondary radiations. The converter layer 202 may completely consist of phosphors or alternatively of a basic material into which the phosphors are introduced for example in particle form. The cover 201 is, in particular, radiation-transmissive to the radiation emitted by the semiconductor chips 102 and/or to the radiation emitted by the converter layer 202.

The whole-area linking of the converter layer 202 to the cover 201 results in an improved transition of the refractive indices from the converter layer 202 to air. In other words, the sudden change in refractive index is reduced as a result and Fresnel losses are reduced as a result. An improved transition of the refractive indices from the AlO particles of the converter layer 202 toward the adjoining air layer occurs for example with the use of a YAG phosphor and a glass window as cover.

The attachment 200 furthermore has a frame 204 extending around the semiconductor chips 102. In this case, the frame 204 is spaced apart from the semiconductor chips 102. The frame 204 forms, in particular, a cavity 205 for the semiconductor chips 102. The frame 204 is in direct contact with the converter layer 202. If the converter layer 202 is applied on that side of the cover 201 which faces the semiconductor chips 102, then the frame 204 is arranged between cover 201 and carrier element 101 and terminates laterally flush with the cover 201. In this case, the converter layer 202 is applied to that region of the cover 201 which is delimited by the frame 204. However, the present disclosure also encompasses the case where the converter layer 202 is applied on that side of the cover 201 which faces away from the semiconductor chips 102; correspondingly, the configuration of the attachment 200, in particular of the frame 204, is then also correspondingly altered and adapted.

The frame 204 is preferably radiation-nontransmissive, i.e. nontransmissive to electromagnetic radiation in the visible, UV and/or IR range, in particular to the radiation emitted by the semiconductor chips 102 and/or the radiation emitted by the converter layer 202. As a result, the frame 204 serves as radiation cone delimitation for the radiation emitted by the optoelectronic component 100, such that a predefined luminance gradient for a light distribution is achieved by means of the frame 204. In particular, the frame 204 may form a shutter edge, i.e. a bright-dark transition, such that a predefined emission characteristic of the optoelectronic component 100 is achieved. Particularly in the case of the use of the optoelectronic component 100 as a motor vehicle headlight, a predefined beam cone for the radiation emitted by the semiconductor chips 102 may be defined by means of the shutter edge.

The frame 204 has an inner surface 207, i.e. a surface 207 facing the semiconductor chips 102 or, in other words, a surface 207 delimiting the cavity 205. For the simple realization of a shutter edge, the surface 207 forms an angle α with the main extension direction of the cover 201, said angle being an acute angle that preferably corresponds to 55°±5°. The frame 204 thus has an undercut in the optoelectronic component 100. In the case where silicon is used for the frame 204, the angle α is equal to 54.7° since this corresponds to the (111) plane of silicon. By means of an etching method, which will be described in more detail later, the frame 204 is thus etched along a specific plane within the solid body, thus resulting in a defined acute angle between surface 207 and main extension direction of the cover 201. As a result of this configuration, the shutter edge, even in the case of an inner converter layer 202, as seen from outside, is still formed sharply. In other words, as a result of the undercut in the frame 204, the converter layer 202, as viewed from outside, is sharply delimited at the edges, such that the shutter edge and thus a defined emission characteristic may be achieved.

The frame 204 consists of thermally conductive material. Since it is in direct contact with the converter layer 202, it is thus suitable for dissipating heat from the converter layer 202. Since the frame 204 furthermore, as already described, is spaced apart from the semiconductor chips 102, the frame 204 dissipates no or only a negligible part of the heat of the semiconductor chips 102, rather only the heat generated by the converter layer 202. The system including frame 204 and converter layer 202, on the one hand, is thermally decoupled to the greatest possible extent from the semiconductor chips 102, on the other hand.

The frame 204 preferably includes one or a plurality of the following materials: silicon, aluminum, boron nitride, zinc oxide and aluminum nitride. The frame may also completely consist of one of the stated materials or of a mixture of the stated materials. In particular, the frame 204 has a thermal conductivity of at least 50 W/mK, preferably of at least 100 W/mK.

The height H of the frame 204, i.e. the extension of the frame along a direction perpendicular to the main extension direction of the carrier element 101, is chosen in particular such that the cover 201 and the converter layer 202 are spaced apart from the semiconductor chips 102, i.e. are not in contact therewith. This has the advantage, as already described, that the converter layer 202 is thermally decoupled from the semiconductor chips 102. The heat of the converter layer 202 is thus predominantly emitted to the frame rather than to the semiconductor chips 102, as in known components. As a result of the spacing between converter layer 202 and semiconductor chips 102, although the etendue may be impaired somewhat in comparison with components in which the converter is applied directly on the semiconductor chip, this impairment, if present, is compensated for by the converter layer 202 sharply delimited at the edges by means of the frame 204. The etendue may be further improved by the application of a light-guiding layer (not illustrated in the figures) into the cavity 205 to the semiconductor chips 102, which links to the converter layer 202. In this way, a light guide is provided which improves firstly the coupling of the radiation out of the semiconductor chips 102 and secondly the coupling of the radiation into the converter layer 202. The light-guiding layer may consist of a pasty silicone layer, for example.

At the underside of the frame 204, i.e. at that side of the frame 204 which faces the carrier element 101, connecting elements 210 are provided, by means of which the frame 204 may be thermally connected to the heat sink. In addition, provision may be made of further fixing means for mechanically connecting the frame 204 to the carrier element 101. The connecting elements 210 may alternatively also additionally be suitable for thermal coupling for a mechanical connection of the frame 204 and thus of the entire attachment 200 to the carrier element 101, such that a fixing of the attachment 200 on the carrier element 101 over and above the connecting elements 210 is not necessary. Extending around the frame 204, a sealing compound 208 for optical sealing may also be provided at the connecting location between frame 204 and carrier element 101.

The connecting elements 210 are preferably bumps. The latter consist of a thermally conductive material, preferably a metal or alloy, for example gold, silver, palladium or a mixture thereof. Instead of the bumps, a thermally conductive adhesive may also be used as connecting element 210.

As shown in FIG. 1A by means of the arrows B, the attachment 200 is placed onto the carrier element 101 and mounted thereon. In the case where bumps are used as connecting elements 210, it is possible to apply the bumps with the carrier element 101 by means of an ultrasound-assisted thermocompression bonding method. In the case of bumps, the connecting elements 210 are applied to contact pads or metallization areas of the carrier element 101. In the case where a thermally conductive adhesive is used, the latter may be cured or crosslinked by known methods, for example thermally or by UV irradiation. For this purpose, the conductor traces or contact pads on the carrier element 101 are covered with an insulation layer having good thermal conductivity, such that the adhesive may be adhesively bonded onto the carrier element 101.

FIG. 1B illustrates the completed optoelectronic component 100 in accordance with the first embodiment. In this case, the attachment 200 is mounted on the carrier element 101 and is mechanically connected thereto either solely via the connecting elements 210 or by means of more extensive fixing devices.

Figure 2:
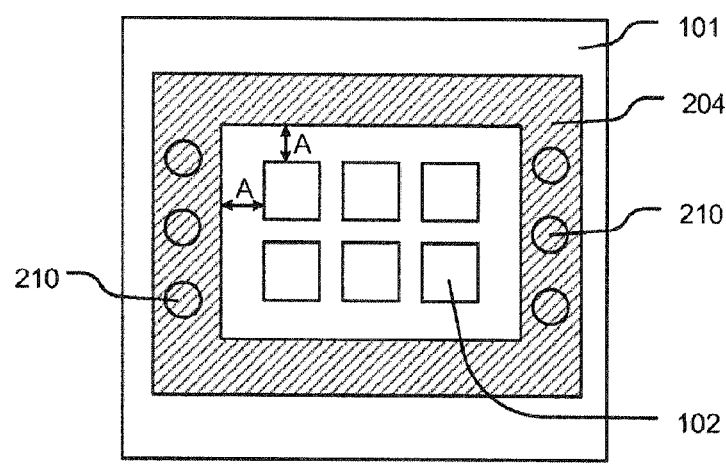
FIG. 2 shows a schematic illustration of a plan view of the optoelectronic component according to the disclosure in accordance with the first embodiment.

FIG. 2 shows a plan view of the optoelectronic component 100 from FIG. 1B. The frame 204 is illustrated as transparent here for the sake of better elucidation, such that the position of the connecting elements 210 may be discerned. The semiconductor chips 102 lie completely within the frame 204. As already explained, the frame 204 is spaced apart from the semiconductor chips 102. Preferably, the frame 204 is at a constant circumferential distance A from the outer edges of the group of semiconductor chips 102. As a result, a uniform illumination of the edge regions is achieved within the beam cone defined by the frame 204.

In this case, the connecting elements 210 are not fitted to the entire frame 204, but rather only to selective positions. The number and position of the connecting elements 210 are intended to ensure a thermal coupling of the frame 204 to the heat sink of the carrier element 101, wherein an increased number of connecting elements 210 also enables an improved thermal linking. The position of the connecting elements 210 is thus provided on the heat sink or at a position of the carrier element 101 which enables an optimum thermal coupling to the heat sink. Depending on the type of the carrier element 101, the connecting elements 210 are applied on potential-free contact pads or on contact pads or metal tracks (conductor tracks) having identical potential, such that it is possible to avoid a short circuit via the connecting elements 210 and the frame 204. The direct linking of the frame 204 to the contact pads via the connecting elements 210 ensures a particularly good thermal linking to the heat sink. Alternatively, an insulation layer for electrical insulation, for example composed of SiO or SiN, may be provided between the connecting elements 210 and the frame 204. Said insulation layer is preferably not thicker than 0.5 µm, such that a good thermal linking of the connecting elements 210 to the frame 204 is still ensured. Arbitrarily polarized connecting elements 210 may be used by virtue of the insulation layer. Depending on whether the connecting elements 210, over and above the function of thermal coupling, are also intended to ensure a mechanical connection of the frame 204 to the carrier element 101, further connecting elements 210 may also be provided.

FIGS. 3A to 3G show a schematic illustration of different views of a first attachment 200 for the optoelectronic component 100 according to the disclosure during different process steps of the production method according to the disclosure in accordance with a first embodiment. In this case, the first attachment 200 corresponds to the attachment 200 as used for the optoelectronic component 100 in accordance with the first embodiment as described in FIGS. 1A, 1B and 2.

In the production method according to the disclosure, in this case a plurality of attachments 200 may be produced in a composite assembly and then be singulated.

Figure 3A:
FIGS. 3A to 3G show a schematic illustration of different views of a first attachment for the optoelectronic component according to the disclosure during different process steps of the production method according to the disclosure in accordance with a first embodiment.
Figure 3B:
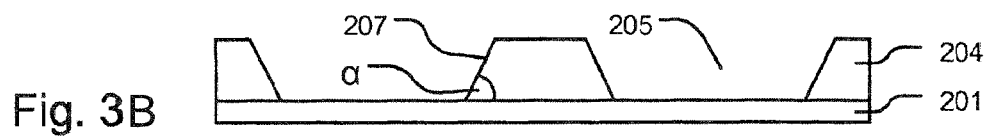

FIG. 3A shows the radiation-transmissive cover 201 with a thermally conductive layer 204a applied thereon. In a subsequent step, the thermally conductive layer 204a is etched away selectively down to the cover 201, for example using buffered hydrofluoric acid. In other words, the thermally conductive layer 204a is etched away in predefined regions, such that the cover 201 is exposed, and the thermally conductive layer 204a is left in other predefined regions. In particular, the etched regions and the regions left form a defined pattern, preferably a repeating pattern. As a result, as shown in FIG. 3B, a plurality of cavities 205 arise, into which the semiconductor chips 102 may be introduced later. The cavities 205 are delimited by the cover 201 on the side opposite the semiconductor chips 102 and are delimited at the sides by the frame 204 extending completely around the cavity 205, said frame having arisen as a result of the etching step. In the finished optoelectronic component 100, the cavity 205 is thus delimited by the etched-free region of the cover 201 with converter layer 202 applied thereon on one side, by the carrier element 101 on the other side, and laterally by the thermally conductive layer 204a left, which forms the frame 204.

Figure 3D:
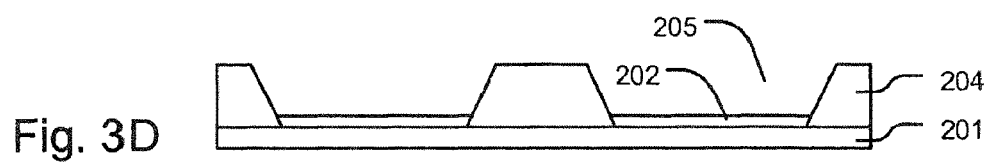
Figure 3E:
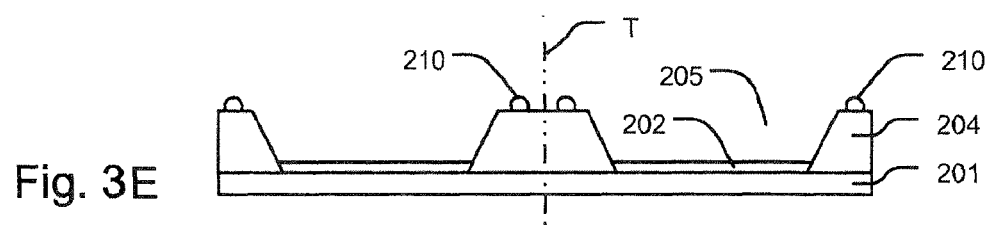
Figure 3F:
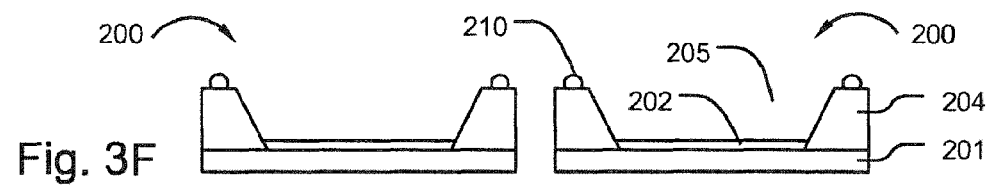
Figures 3C, 3G:
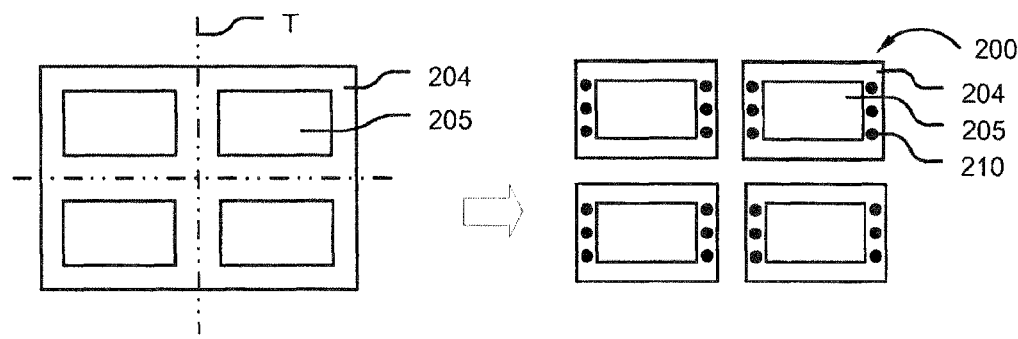

This configuration is illustrated once again in FIG. 3C. FIG. 3C shows a bottom view of the intermediate product from FIG. 3B, i.e. a view of the cavity 205. In the present example, a composite assembly including a total of four attachments 200 is produced, but this should be understood to be merely by way of example, rather the present disclosure encompasses any type of composite assembly with an arbitrary number of attachments 200 to be produced in an arbitrary arrangement. As may be seen in FIG. 3C, the cavities 205 are selectively etched into the thermally conductive layer 204a, such that each cavity 205 is surrounded by a circumferentially extending frame 204 composed of thermally conductive material. After completion, the individual attachments may then be separated from one another along the separating lines T, i.e. along the respective center of the frame 204, and thus be singulated. Those regions of the thermally conductive layer 204a between two cavities 205 respectively which are not etched away are therefore preferably mirror-symmetrical with respect to the separating lines, such that frames 204 of identical type are formed in each case around the cavities after separation.

As already explained, during etching it is possible to obtain any arbitrary angle α between the surface 207 of the frame facing the cavity 205 and the main extension direction of the cover 201. Both obtuse angles and acute angles are possible in this case. Preferably, however, the angle α is an acute angle, as a result of which the imaging of a sharp shutter edge becomes possible. In order to simplify the etching process and to obtain a planar surface 207, the orientation of the surface 207 may be chosen such that it corresponds to a plane of the crystal lattice of the thermally conductive layer 204a. In the case where silicon is used as the thermally conductive layer 204a, therefore, etching is effected along the (111) plane and the angle α corresponds to 54.7°.

Proceeding from the intermediate product illustrated in FIG. 3B, in a subsequent step, the converter layer 202 is then applied to the etched-free regions of the cover 201, as illustrated in the intermediate product in FIG. 3D. In this case, the converter layer is preferably applied only on that region of the cover 201 which lies within the cavity 205 or within the frame 204. In this case, the converter layer 202 extends over a negligibly small part of the surface 207 facing the cavity 205. Alternatively, however, the converter layer 202 may also be applied along the entire surface 207 of the frame 204. Only the underside of the frame 204, i.e. the side which is intended to be placed onto the carrier element 101 later, must be free of the converter layer 202, since otherwise a reliable thermal and/or mechanical linking of the attachment 200 to the carrier element 101 is not ensured. The converter layer 202 may be applied by means of sedimentation, for example.

In a subsequent step, as shown in FIG. 3E, the connecting elements 210 are applied to the frame 204. In this context, at the edge of the cavity 205 in each case only one connecting element 210 or only one set or one series of connecting elements 210 is applied to the frame 204, whereas in each case two connecting elements 210 or two sets or series of connecting elements 210 are provided on the frame 204 between two adjacent cavities 205. As a result, the individual attachments 200 may be separated along the separating line T and, at the same time, at the singulated attachment 200, the corresponding connecting elements 210 are then provided on the frame 204. In other words, preferably on a frame 204 between two adjacent cavities 205, the connecting elements 210 are mirror-symmetrical with respect to the separating line T. The production process is simplified by this uniform procedure. However, any other arrangement is also possible. In particular, different types and/or arrangements of connecting elements may be necessary depending on the configuration of the carrier element 101. These may already be realized in the composite assembly.

In the subsequent step, the attachments 200 are singulated from the composite assembly by the intermediate product from FIG. 3E being separated along the separating lines T, wherein the separating lines run in each case in the center of the frame 204 between two adjacent cavities 205.

FIG. 3G shows, in a manner corresponding to FIG. 3C, a bottom view of the finished attachments 200 which were obtained from the composite assembly shown in FIG. 3C by means of singulation. Each attachment 200 correspondingly includes a cavity 205 surrounded by the circumferentially extending frame 204. The connecting elements 210 are provided on the underside of the frame 204. FIG. 3G shows by way of example six connecting elements 210 for each attachment 200, although the present disclosure is not restricted to the shown number and arrangement of the connecting elements, rather, as described above, the present disclosure concomitantly encompasses any number and arrangement of connecting elements, depending on the function of the connecting elements 210 and/or configuration of the carrier element 101.

The attachments 200 shown in FIGS. 3F and 3G may then be used for producing the optoelectronic component 100 according to the disclosure in accordance with the first embodiment. For this purpose, the attachment 200 is placed onto the carrier element 101 in such a way that the semiconductor chips 102 lie within the cavity 205 formed by cover 201 with converter layer 202 and frame 204. Subsequently, the attachment is connected to the carrier element 101 by means of the connecting elements 210. In this regard, the frame 204 and thus the converter layer 202 are thermally connected to the heat sink of the carrier element 101. Such an optoelectronic component 100 in accordance with the first embodiment has already been described with reference to FIGS. 1A, 1B and 2.

FIGS. 4A to 4G show a schematic illustration of a cross section of a second attachment 220 for an optoelectronic component according to the disclosure during different process steps of the production method according to the disclosure in accordance with a second embodiment. Unless described otherwise, the component parts and process steps correspond to the component parts and process steps described with reference to FIGS. 3A to 3G. Consequently, all explanations given with reference to FIGS. 3A to 3G also apply to FIGS. 4A to 4G, unless explicitly described otherwise.

Figure 4A:
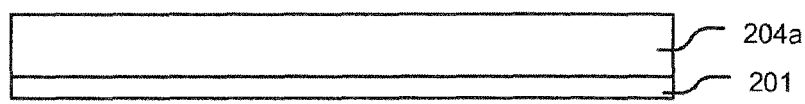
FIGS. 4A to 4G show a schematic illustration of a cross section of a second attachment for the optoelectronic component according to the disclosure during different process steps of the production method according to the disclosure in accordance with a second embodiment.
Figure 4B:
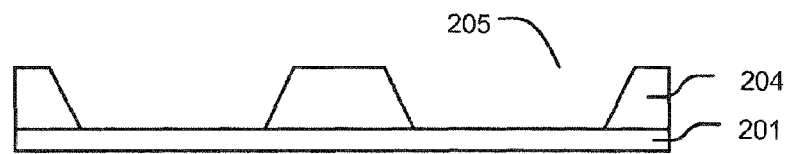

FIG. 4A shows analogously to FIG. 3A the radiation-transmissive cover 201 with a thermally conductive layer 204a. After the selective etching of the thermally conductive layer 204a, as illustrated in FIG. 4B analogously to FIG. 3B, cavities 205 are formed around which the thermally conductive layer extends as frame 204.

Figure 4C:
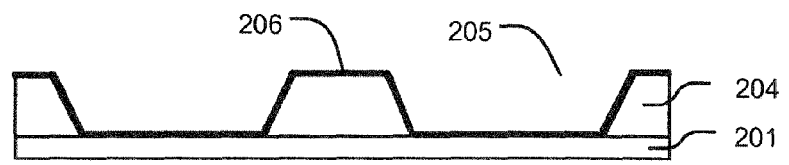

Unlike in the case of the sedimentation described with reference to FIG. 3D, as shown in FIG. 4C, an electrically conductive layer 206 is applied to the entire surface, i.e. both to the etched-free cover 201 and to the frame 204. Preferably, the electrically conductive layer 206 is a layer composed of indium tin oxide (abbreviated to ITO), but any other electrically conductive material may also be used. In order to simplify the process, in this case the electrically conductive layer 206 is applied to all surfaces along the entire composite assembly, although parts of the surface may also be omitted.

Figure 4D:
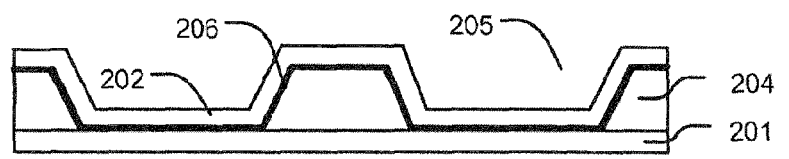

As illustrated in FIG. 4D, the converter layer 202 is subsequently applied. In contrast to the first attachment 200 described with reference to FIGS. 3A to 3G, in this second embodiment of the production method according to the disclosure, the converter layer 202 is not applied by means of sedimentation, but rather by means of electrophoresis, for which purpose the electrically conductive layer 206 is required. In this case, the converter layer 202 is applied on the entire electrically conductive layer 206; consequently, in the case of an electrically conductive layer 206 applied over the whole area, the areas of the frame 204 which later are mounted onto the carrier element 101 by means of the connecting elements 210 are also covered by the electrically conductive layer 206 and the converter layer 202.

Figure 4E:
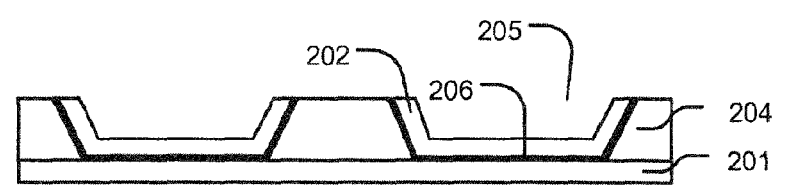
Figure 4F:
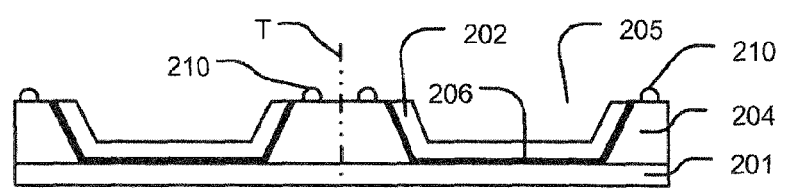

In order to ensure a reliable connection of the frame 204 to the carrier element 101, as shown in FIG. 4E, the frame 204 is freed of the electrically conductive layer 206 and the converter layer 202 at these locations by means of grinding or other processes for material removal. Subsequently, at the locations freed by grinding, the connecting elements 210 are applied to the frame 204, as shown in FIG. 4F. If the electrically conductive layer 206 was not applied to those areas of the frame 204 onto which the connecting elements 210 are placed, then the step of grinding may be omitted. In this case, the arrangement and type of the connecting elements 210 correspond to the explanations given with reference to FIGS. 3E to 3G.

Figure 4G:
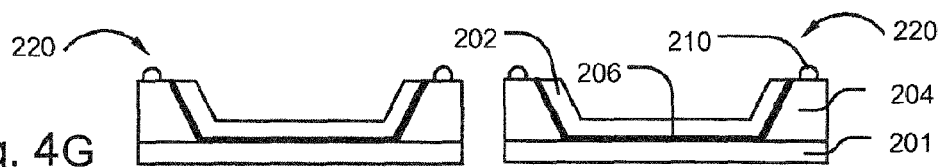

In a manner corresponding to the explanations concerning FIGS. 3A to 3G, FIG. 4F likewise again illustrates the separating line T along which the composite assembly is singulated into individual attachments 220. Finally, FIG. 4G shows the completed second attachments 220 for use in an optoelectronic component according to the disclosure.

Figure 5:
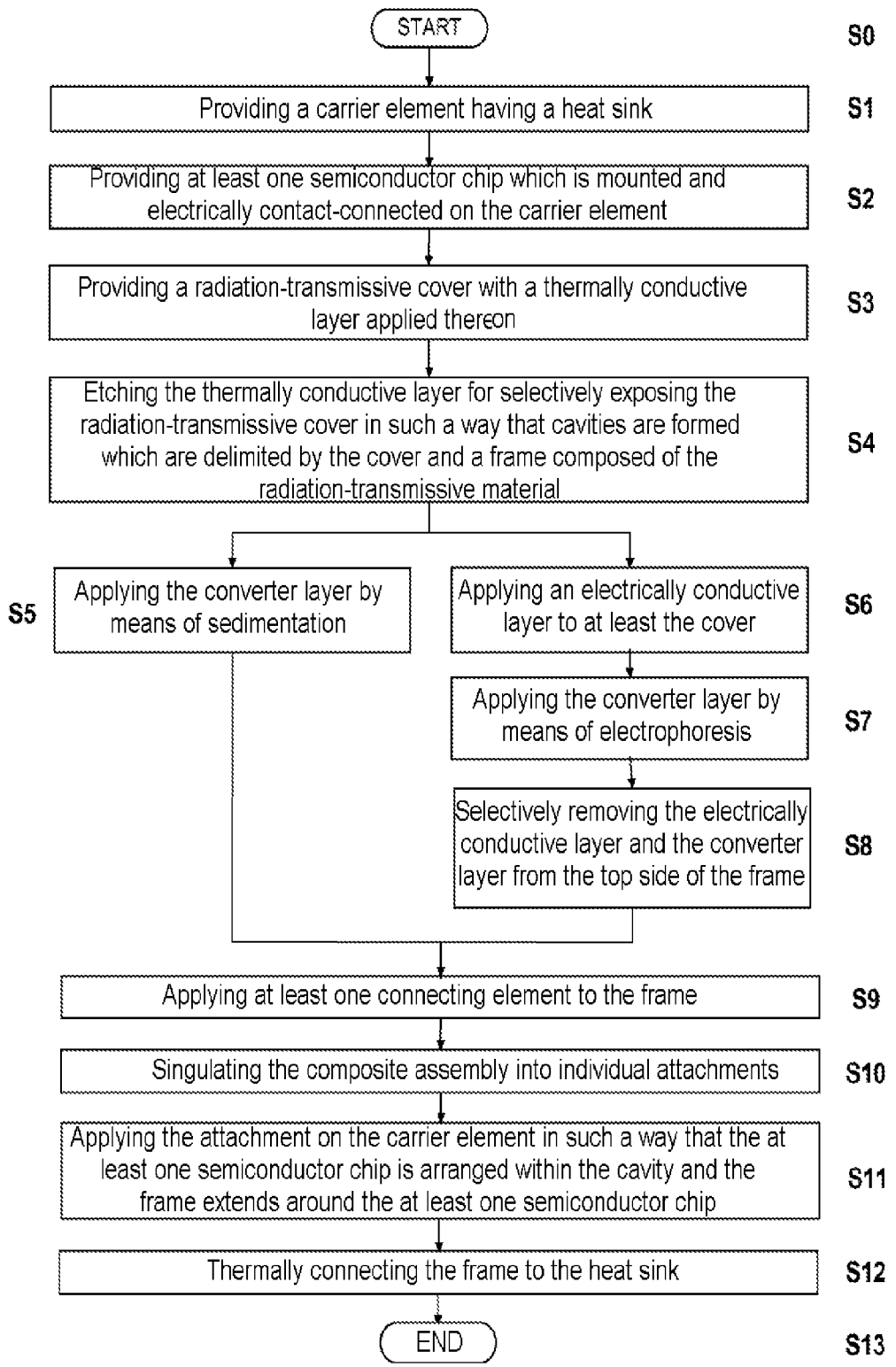
FIG. 5 shows a flowchart with the method steps of the production method according to the disclosure.

Referring to FIG. 5, the production method according to the disclosure will now be described on the basis of the individual process steps. An optoelectronic component described may thus be produced by means of the method described. That is to say that all features described for the optoelectronic component are also disclosed for the method, and vice versa.

A first step S1 involves providing a carrier element 101, 111, 121 having a heat sink. The subsequent step S2 involves providing at least one semiconductor chip 102 for emitting electromagnetic radiation which is mounted and electrically contact-connected on the carrier element 101, 111, 121.

The subsequent steps S3 to S8 involve providing an attachment 200, 220 for the carrier element 101, 111, 121. In this case, providing the attachment 200, 220 includes, in particular, the substeps described below.

A first substep S3 involves providing a radiation-transmissive cover 201 with a thermally conductive layer 204a applied thereon. The connection between radiation-transmissive cover 201 and thermally conductive layer 204a is effected by anodic bonding, for example. By way of example, the radiation-transmissive cover 201 may be composed of glass and it is possible to use a BF33 wafer, to which a monolithic 6" or 8" silicon wafer is applied by means of anodic bonding.

The subsequent substep S4 involves etching the thermally conductive layer 204a, such that the cover 201 is selectively exposed, as already described above. The etching is effected, in particular, in such a way that cavities 205 are formed which are formed by the cover 201 and a frame 204 composed of radiation-transmissive material 204a.

Afterward, the converter layer is applied, wherein this may be carried out in two ways. The production method according to the disclosure in accordance with the present disclosure thus differs in particular in the application of the converter layer.

The production method in accordance with the first embodiment is illustrated in the branch with step S5. In this case, the converter layer 202 is applied by means of sedimentation. The application is preferably carried out such that only the etched-free regions of the cover 201 and the frame 204 remain substantially free of the converter layer 202.

The production method in accordance with the second embodiment is illustrated in the branch with steps S6 to S8. Here the converter layer 202 is applied by means of electrophoresis. For this purpose, in the first step S6, an electrically conductive layer 206 is applied to at least the cover 201, preferably to the entire surface, i.e. to the cover 201 and all areas of the frame 204. Subsequently, in step S7, the converter layer 202 is applied by means of electrophoresis.

In the subsequent step S8, those areas of the frame 204 which later face the carrier element 101, 111, 121 are freed of converter layer 202 and electrically conductive layer 206 in order to enable the fitting of the connecting elements 210 and the fitting on the carrier element 101, 111, 121. This may be carried out by means of grinding, for example. Step S8 may also be omitted if the electrically conductive layer 206 and the converter layer 202 are not applied to the top side of the frame 204.

In the subsequent substep S9, the at least one connecting element 210 is applied to the frame 204. In the last substep S10, the composite assembly of attachments 200, 220 thus produced is then singulated to form individual attachments 200, 220.

After the conclusion of the substeps for providing the attachment 200, 220, in the subsequent step S11 the attachment 200, 220 is applied on the carrier element 101, 111, 121 in such a way that the at least one semiconductor chip 102 is arranged within the cavity 205 and the frame 204 extends around the at least one semiconductor chip 102.

The next step S12 involves thermally connecting the frame 204 to the heat sink of the carrier element 101, 111, 121 by means of the at least one connecting element 210.

The production method ends in step S13 with the completed optoelectronic component 100, 110, 120 according to the present disclosure.

Figure 6:
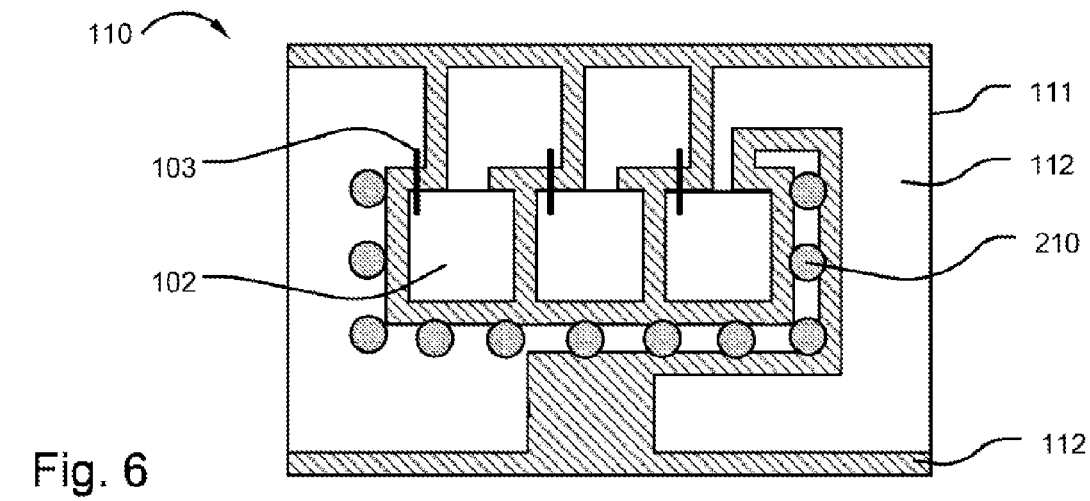
FIG. 6 shows a schematic illustration of a plan view of an optoelectronic component according to the disclosure in accordance with a second embodiment.

FIG. 6 shows a schematic illustration of a plan view of an optoelectronic component 110 according to the disclosure in accordance with a second embodiment. For the sake of better illustration and clarity, the circumferentially extending frame is not illustrated in the figure.

The optoelectronic component 110 in accordance with the second embodiment includes a carrier element 111, on which three semiconductor chips 102 are applied in the present example. However, a different number and/or arrangement of semiconductor chips 102 may also be provided. The carrier element 111 has contact pads 112 at its top side, via which contact pads the semiconductor chips 102 are electrically contact-connected. In the present case, contact pads 112 should be understood to mean any type of electrically conductive surface, for example metallization area, metallization islands, conductor tracks or the like. In particular, the contact-connection may be effected by means of a bonding wire 103, although other types of contact-connection are also possible. The contact pads 112 are electrically insulated from one another by means of insulating regions 113. Since the connecting elements 210 and the frame 204 may be electrically conductive depending on material, in particular with the use of a frame composed of silicon and connecting elements composed of silver, gold or other electrically conductive materials, in the optoelectronic component 110 in accordance with the second embodiment the connecting elements 210 are provided on one or a plurality of contact pads 112 having identical potential. A short circuit is prevented as a result.

Figure 7:
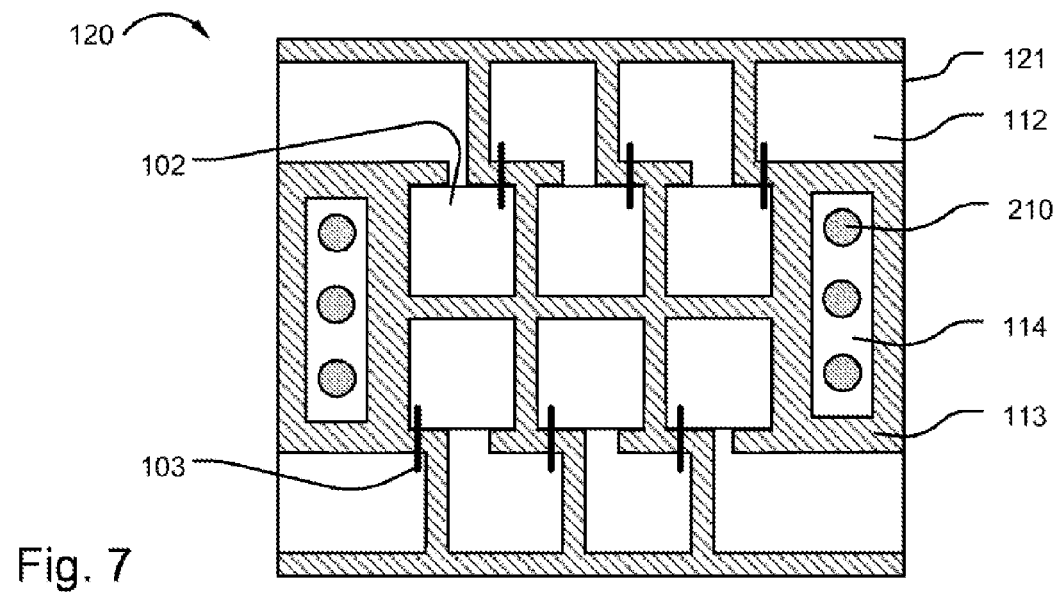
FIG. 7 shows a schematic illustration of a plan view of an optoelectronic component according to the disclosure in accordance with a third embodiment.

FIG. 7 shows a schematic illustration of a plan view of an optoelectronic component 120 according to the disclosure in accordance with a third embodiment. For the sake of better illustration and clarity, the circumferentially extending frame is again not illustrated in the figure.

The optoelectronic component 120 in accordance with the third embodiment includes a carrier element 121, on which six semiconductor chips 102 in a three by two matrix are applied in the present example. However, a different number and/or arrangement of semiconductor chips 102 may also be provided. The carrier element 121 once again has contact pads 112 at its top side, via which the semiconductor chips 102 are electrically contact-connected. In particular, the contact-connection may be effected by means of a bonding wire 103, although other types of contact-connection are also possible. The contact pads 112 are electrically insulated from one another by means of insulating regions 113. Since the connecting elements 210 and the frame 204 may be electrically conductive depending on material, in particular with the use of a frame composed of silicon and connecting elements composed of silver, gold or other electrically conductive materials, in the optoelectronic component 120 in accordance with the third embodiment the connecting elements 210 are provided on one or a plurality of potential-free contact pads 114. A short circuit is prevented as a result.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS

100 Optoelectronic component in accordance with the first embodiment
101 Carrier element for 100
102 Semiconductor chip
103 Bonding wire
104 Contact side
108 Radiation emission side
110 Optoelectronic component in accordance with the second embodiment
111 Carrier element for 110
112 Contact pad
113 Insulating region
114 Potential-free contact pad
120 Optoelectronic component in accordance with the third embodiment
121 Carrier element for 120
200 First attachment
201 Radiation-transmissive cover
202 Converter layer
204 Frame
204a Thermally conductive layer
205 Cavity
206 Electrically conductive layer
207 Surface of the frame 204 facing the cavity 205
208 Sealing compound
210 Connecting element
220 Second attachment

The invention claimed is:

1. An optoelectronic component comprising:
a thermally conductive carrier element,
at least one semiconductor chip for emitting electromagnetic radiation which is mounted and electrically contact-connected on the thermally conductive carrier element,
a radiation-transmissive cover disposed downstream of the at least one semiconductor chip,
a converter layer applied on the radiation-transmissive cover and spaced apart from the at least one semiconductor chip,
a thermally conductive frame , which thermally conductive frame extends around the at least one semiconductor chip and is in direct contact with the converter layer and the radiation-transmissive cover, and at least one connecting element for thermally connecting the thermally conductive frame to the thermally conductive carrier element to form a heat, wherein the angle between a surface of the frame facing the at least one semiconductor chip and the main extension direction of the cover is an acute angle.

2. The optoelectronic component as claimed in claim 1, wherein the converter layer is applied on that side of the radiation-transmissive cover which faces the at least one semiconductor chip.

3. The optoelectronic component as claimed in claim 2, further comprising a light-guiding layer between the at least one semiconductor chip and the converter layer.

4. The optoelectronic component as claimed in claim 1, wherein the radiation-transmissive cover comprises or consists of a plastics material, glass and/or ceramic material.

5. The optoelectronic component as claimed in claim 1, wherein the frame consists of silicon, aluminum, boron nitride, zinc oxide and/or aluminum nitride.

6. The optoelectronic component as claimed in claim 1, wherein the frame forms a shutter edge.

7. The optoelectronic component as claim 1, wherein the at least one connecting element comprises a bump.

8. The optoelectronic component as claimed in claim 7, wherein the bump is composed of gold, silver or palladium.

9. The optoelectronic component as claimed in claim 7, further comprising
an electrically insulating layer between the frame and the bump.

10. The optoelectronic component as claimed in claim 9, wherein the electrically insulating layer has a thickness of a maximum of 0.5 µm.

11. The optoelectronic component as claimed claim 1, wherein the at least one connecting element comprises a thermally conductive adhesive.

12. The optoelectronic component as claim 1,
wherein the carrier element has electrically conductive contact pads for electrically contact-connecting the at least one semiconductor chip, and
wherein the at least one connecting element is arranged along contact pads with identical electrical potential.

13. The optoelectronic component as claimed claim 1,
wherein the carrier element has electrically conductive contact pads for electrically contact-connecting the at least one semiconductor chip, and
wherein the at least one connecting element is arranged along one or a plurality of potential-free contact pads.

14. The optoelectronic component as claimed in claim 1, wherein the angle is 55°±2°.

15. A method for producing an optoelectronic component, comprising:
providing a thermally conductive carrier element,
providing at least one semiconductor chip for emitting electromagnetic radiation which is mounted and electrically contact-connected on the thermally conductive carrier element,
providing an attachment for the thermally conductive carrier element, wherein said providing the attachment comprises the following:
providing a radiation-transmissive cover with a thermally conductive layer directly applied thereon,
etching the thermally conductive layer for selectively exposing the radiation-transmissive cover in such a way that cavities are formed which are delimited by the cover composed of the radiation-transmissive material and a thermally conductive frame,
applying a converter layer at least to the etched-free regions of the radiation-transmissive cover,
applying at least one connecting element to the thermally conductive frame, and
singulating the composite assembly into individual attachments along the frame,
applying an attachment on the thermally conductive carrier element in such a way that the at least one semiconductor chip is arranged within the cavity and the thermally conductive frame extends around the at least one semiconductor chip, and that the converter layer is spaced apart from the at least one semiconductor chip, and
thermally connecting the thermally conductive frame to the thermally conductive element to form a heat sink by means of the connecting elements,
wherein the angle between a surface of the frame facing the at least one semiconductor chip and the main extension direction of the cover is an acute angle.

16. The method as claimed in claim 15,
wherein said applying the converter layer comprises applying the converter layer by means of sedimentation.

17. The method as claimed in claim 15,
wherein said applying the converter layer comprises applying an electrically conductive layer and subsequently applying the converter layer by means of electrophoresis.

* * * * *